(12) United States Patent
Kihara et al.

(10) Patent No.: US 8,952,730 B2
(45) Date of Patent: Feb. 10, 2015

(54) DRIVER CIRCUIT (75) Inventors: Seiichiro Kihara, Osaka (JP); Akio Nakajima, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/879,940

(22) PCT Filed: Jul. 25, 2011

(86) PCT No.: PCT/JP2011/066831
§ 371 (c)(1),
(2), (4) Date: Apr. 17, 2013

(87) PCT Pub. No.: WO2012/053264
PCT Pub. Date: Apr. 26, 2012

(65) Prior Publication Data
US 2013/0200926 A1 Aug. 8, 2013

(30) Foreign Application Priority Data

Oct. 18, 2010 (JP) ................................. 2010-233322
May 11, 2011 (JP) ................................. 2011-106293

(51) Int. Cl.
*H03K 3/00* (2006.01)
*H03K 17/687* (2006.01)
*H03K 17/06* (2006.01)

(52) U.S. Cl.
CPC ............ *H03K 17/687* (2013.01); *H03K 17/063* (2013.01)
USPC ......................................................... 327/108

(58) Field of Classification Search
None
See application file for complete search history.

(56) References Cited

U.S. PATENT DOCUMENTS

| 5,120,992 | A  | * | 6/1992 | Miller et al. | 327/111 |
| 7,888,977 | B2 | * | 2/2011 | Sheng | 327/110 |
| 8,384,444 | B1 | * | 2/2013 | Lucero et al. | 327/108 |
| 2007/0121356 | A1 | | 5/2007 | Lee | |
| 2007/0216469 | A1 | * | 9/2007 | Sakamoto | 327/519 |
| 2008/0205100 | A1 | | 8/2008 | Sakamoto | |

FOREIGN PATENT DOCUMENTS

| JP | 2006-314154 A | 11/2006 |
| JP | 2007-288992 A | 11/2007 |
| JP | 2008-211703 A | 9/2008 |
| JP | 2010-35389 A | 2/2010 |

* cited by examiner

*Primary Examiner* — Lincoln Donovan
*Assistant Examiner* — Khareem E Almo
(74) *Attorney, Agent, or Firm* — Birch, Stewart, Kolasch & Birch, LLP (57) ABSTRACT A gate driver circuit that can supply a negative gate voltage to a high-side circuit without being additionally provided with an insulated power supply is realized. A driver circuit is configured such that a half-bridge circuit in which a first transistor and a second transistor are connected in series includes a capacitor that supplies a negative gate voltage to a high-side first transistor via a first control circuit, and a control circuit power supply that supplies a negative gate voltage to a low-side second transistor via a second control circuit, one end of the capacitor being connected to a negative voltage VEE on a negative terminal side of the control circuit power supply via a switching element, and the other end being connected to a voltage on an output terminal, wherein the switching element is controlled to be on upon a timing when the second transistor is turned on.

9 Claims, 7 Drawing Sheets

DRIVER CIRCUIT

CROSS-REFERENCE TO RELATED APPLICATIONS

This application is a National Phase filing under 35 U.S.C. §371 of International Application No. PCT/JP2011/066831 filed on Jul. 25, 2011, and which claims priority to Japanese Patent Applications No. 2010-233322 filed on Oct. 18, 2010 and No. 2011-106293 filed on May 11, 2011, all of which are hereby expressly incorporated by reference into the present application.

TECHNICAL FIELD

The present invention relates to a driver circuit, and more particularly, when a half-bridge circuit is formed by using, as a switching element, a wide bandgap semiconductor, such as GaN or SiC, having a normally-on characteristic in which a threshold voltage is a negative voltage, or having a normally-off characteristic in which the threshold value is low such as about 2 V, the present invention relates to a circuit that feeds a negative gate voltage for turning off the switching element.

BACKGROUND ART

A wide bandgap semiconductor represented by GaN or SiC has excellent characteristics such as high-speed switching and low-on resistance, compared to a silicon semiconductor. On the other hand, an element using the wide bandgap semiconductor exhibits a normally-on characteristic in which a drain current flows even if a gate voltage is 0 V, or a normally-off characteristic in which a threshold voltage is low such as about 2 V. In order to surely turn off the element, it is necessary that the gate voltage is driven to a negative voltage, whereby a driver circuit that feeds the negative gate voltage is needed.

Non-Patent Document 1 describes a buffer circuit that is driven by negative gate/bias voltage.

Patent Document 1 describes a semiconductor circuit for a switching element having a normally-on characteristic, or for a switching element having a normally-off characteristic in which the threshold voltage is low.

In Patent Document 1, a power supply circuit for generating a negative voltage that is to be fed to a high-side (high-voltage side) switching element, and a power supply circuit for generating a negative voltage that is to be fed to a low-side (low-voltage side) switching element are provided, wherein the high-voltage side of the high-side power supply circuit is connected to a positive terminal of the high-voltage power supply. Further, a control capacitor whose one end is connected to the low-voltage (negative voltage) side of the high-side power supply circuit is provided. The control circuit that controls on/off of the switching element is supplied with operating power supply from the control capacitor that is charged when the switching element is turned on. One example of the power supply circuit described is a negative voltage power supply formed such that electric current is flown through the capacitor via another switching element, and a zener diode is connected to the capacitor in parallel.

Patent Document 2 describes a power converter that supplies a negative voltage to a high-side normally-on switching element by using a constant voltage diode (zener diode).

PRIOR ART DOCUMENT

Non-Patent Document

Non-Patent Document 1: International Rectifier Japan Application Note AN-1120

Patent Document

Patent Document 1: Japanese Patent Application Laid-Open No. 2007-288992
Patent Document 2: Japanese Patent Application Laid-Open No. 2006-314154

DISCLOSURE OF THE INVENTION

Problems to be Solved by the Invention

When the negative voltage is supplied to the high-side circuit, a boot strap circuit that includes a diode and a capacitor and is used in an inverter gate driver circuit cannot be used because of a problem of a polarity of the diode. Therefore, Non-Patent Document 1 describes that an insulated power supply is needed on the high side.

In Patent Document 1, a high-side internal power supply circuit is configured such that the high-voltage side is connected to the positive terminal of the high-voltage power supply as described above, so that it might possibly cause short-circuit since electric current flows from the high-voltage power supply. Therefore, the high-side internal power supply circuit needs to be an insulated power supply to prevent the short-circuit. The high side and the low side respectively need a power supply.

In Patent Document 1, the high-side power supply is realized by using the switching element, the capacitor, and the zener diode, but it is difficult to produce a zener diode having high breakdown voltage, and this imposes a limitation on a range of a power-supply voltage.

Similarly, the constant voltage diode (zener diode) used in Patent Document 2 also imposes limitation on the usable range of the power-supply voltage due to the limitation of the breakdown voltage.

In general, it is necessary that a FWD (free wheel diode) having less reverse recovery current is connected in parallel with the switching element in an inverter semiconductor in order to suppress reverse power loss and noise. Although a lateral device doing a unipolar operation has a reverse conducting function in a normally-on FET, an absolute value of a reverse conducting on-set voltage is large due to the low gate voltage (in general, −10 V or less) when it is turned off. Therefore, the FWD has to be connected in parallel as in the case described above.

These problems increase cost, since the driver circuit becomes large-sized, and has a complicated structure, and prohibits the progress of the driver circuit using the wide-gap semiconductor.

The present invention is accomplished in view of the above-mentioned circumstance, and aims to provide a driver circuit that can supply a negative gate voltage required for driving a switching element, without causing an increase in size of the circuit and causing a complicated structure.

Means for Solving the Problem

A driver circuit according to the present invention to attain the above aim includes a first transistor in which one end of a pair of input-output terminals is connected to a first power-supply voltage, and a second transistor in which one end of a pair of input-output terminals is connected to a second power-supply voltage that is lower than the first power-supply voltage, the first transistor and the second transistor being connected in series, and outputs a voltage of an intermediate node between the first transistor and the second transistor. The driver circuit is characterized by comprising:

a first control circuit that includes a high-voltage-side power-supply terminal and a low-voltage-side power-supply terminal, and that outputs a first control signal for controlling on/off of the first transistor to a control terminal of the first transistor based upon an input signal;

a second control circuit that has a high-voltage-side power-supply terminal and a low-voltage-side power-supply terminal, and that outputs a second control signal for controlling on/off of the second transistor to a control terminal of the second transistor based upon an input signal;

a switching element; and a capacitor that generates a power-supply voltage that is to be supplied to the first control circuit, wherein one end of the capacitor is connected to a third power-supply voltage lower than the second power-supply voltage via the switching element, and the other end of the capacitor is connected to the other end of the input-output terminals of the first transistor, the voltage on one end of the capacitor is supplied to the low-voltage-side power-supply terminal of the first control circuit, the third power-supply voltage is supplied to the low-voltage-side power-supply terminal of the second control circuit, the first control circuit outputs the voltage supplied to the low-voltage-side power-supply terminal of the first control circuit as the first control signal, when turning off the first transistor, the second control circuit outputs the voltage supplied to the low-voltage-side power-supply terminal of the second control circuit as the second control signal, when turning off the second transistor, and the switching element is controlled to be in on state when the second transistor is in on state.

Further, the driver circuit having the above characteristic according to the present invention is preferably configured such that the first transistor is a normally-on n-channel FET using a wide-gap semiconductor, and the high-voltage-side power-supply terminal of the first control circuit is connected to the other end of the input-output terminals of the first transistor.

Further, the driver circuit having the above characteristic according to the present invention is preferably configured such that the second transistor is a normally-on n-channel FET using a wide-gap semiconductor, and the high-voltage-side power-supply terminal of the second control circuit is connected to the second power-supply voltage.

The wide-gap semiconductor means a semiconductor material having a bandgap larger than that of silicon, and it is represented by, for example, a material such as SiC, GaN, or diamond, having a bandgap of 2.2 eV or more that is twice the bandgap of silicon of 1.12 eV.

Further, the driver circuit having the above characteristic according to the present invention is preferably configured such that the switching element includes a MOSFET.

Further, the driver circuit having the above characteristic according to the present invention is preferably configured such that on/off of the switching element is controlled based upon the second control signal.

The driver circuit having the above characteristic according to the present invention is preferably configured such that on/off of the switching element is controlled based upon a signal resulting from a logical AND of the input signal inputted to the second control circuit and a delay signal of the input signal.

The driver circuit having the above characteristic according to the present invention is preferably configured such that on/off of the switching element is controlled based upon a signal resulting from a logical AND of the input signal inputted to the second control circuit and the second control signal.

Further, the driver circuit having the above characteristic according to the present invention is preferably configured such that, in a case where the first transistor is a normally-on n-channel FET, the third power-supply voltage is set to be a voltage by which a reverse conducting operation of the first transistor is possible, when the first transistor is turned off by the input of the first control signal.

Further, the driver circuit having the above characteristic according to the present invention is preferably configured such that, in the case where the second transistor is a normally-on n-channel FET, the third power-supply voltage is set to be a voltage by which a reverse conducting operation of the second transistor is possible, when the second transistor is turned off by the input of the second control signal.

Further, the driver circuit having the above characteristic according to the present invention is preferably configured such that the third power-supply voltage is set such that a reverse conducting on-set voltage of at least either one of the first transistor and the second transistor falls within a range of −1.5 V to −3.0 V.

Effect of the Invention

According to the driver circuit having the above-mentioned characteristics, the negative gate voltage can be supplied to the low-side control circuit (second control circuit), and the control terminal of the second transistor via the third power-supply voltage, the capacitor that supplies the third power-supply voltage can be charged via the switching element that becomes on when the second transistor is on, and the negative gate voltage can be supplied to the high-side control circuit (the first control circuit) and the first transistor.

Accordingly, the driver circuit can supply the negative voltage to the high-side circuit without additionally providing an insulated power supply, whereby the driver circuit for making a drive control of the switching element using a wide-gap semiconductor can easily be formed. In addition, the low-on resistance and high-speed switching characteristic of the switching element using the wide-gap semiconductor can be obtained, resulting in that the high-speed operation and reduced power consumption of the driver circuit can be realized.

Figure 7:
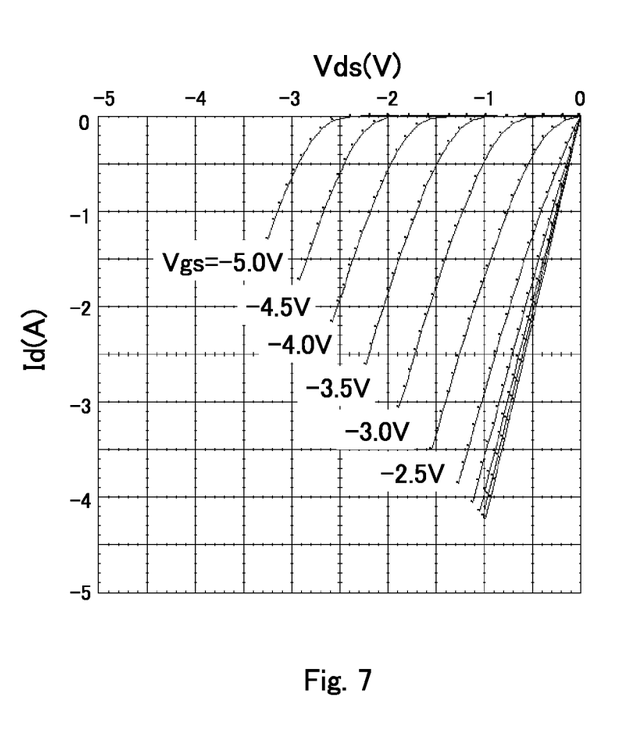
FIG. 7 is a view illustrating a reverse conducting characteristic of a normally-on FET.

As illustrated in FIG. 7 illustrating dependency of a reverse conducting characteristic (a change in current Id flowing between a drain and a source when a voltage Vds that is negative with respect to the source is applied to the drain side) of a normally-on FET, having a threshold voltage Vth of −2.5 V, on a gate voltage Vgs, the reverse conducting on-set voltage falls within the range of −1.5 V to −3 V by setting the gate voltage Vgs to be applied in the off state to be within the range of −4 V to −5.5 V. Accordingly, when the first transistor or the second transistor is the normally-on FET, the third power-supply voltage and the negative gate voltage supplied via the third power-supply voltage can be set in order that the transistor can make the reverse conducting operation with respect to an expected voltage fluctuation caused by noise. Specifically, the third power-supply voltage and the negative gate voltage supplied via the third power-supply voltage can be set in order that reverse conducting operation is possible with a reverse conducting on-set voltage whose absolute value is low within the range of −1.5 V to −3.0 V.

Since the absolute value of the reverse conducting on-set voltage during the off state of the normally-on FET can be reduced as described above, the driver circuit according to the present invention can surely make the reverse conducting operation without being provided with an FWD that has to be generally connected to the inverter switching element in parallel.

MODE FOR CARRYING OUT THE INVENTION

First Embodiment

Figure 1:
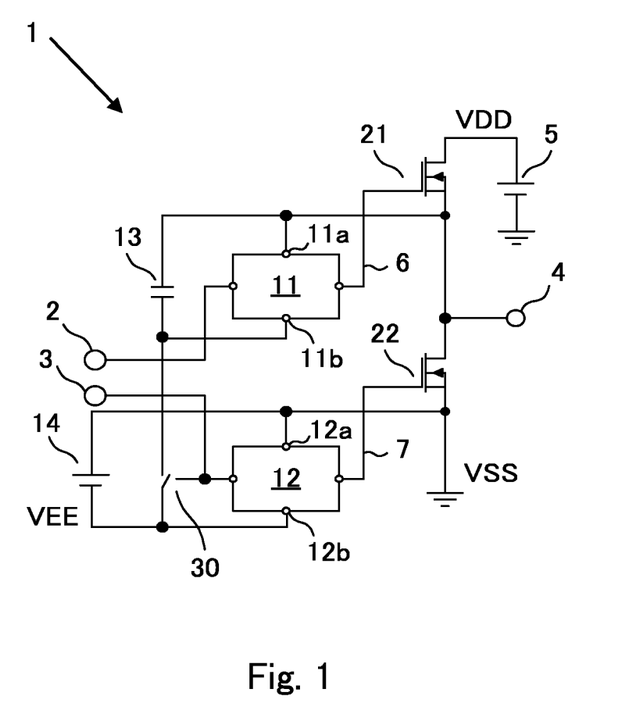
FIG. 1 is a circuit diagram illustrating an example of a structure of a driver circuit according to the present invention.

FIG. 1 illustrates an example of a structure of a driver circuit 1 according to one embodiment of the present invention. The same components are identified by the same numerals in all figures used for the description of the following embodiments, and the name and function are the same, so that the similar description will not be repeated.

As illustrated in the circuit block diagram in FIG. 1, the driver circuit 1 includes a high-side first control circuit 11, a low-side second control circuit 12, a capacitor 13, a control circuit power supply 14, a switching element 30, a first transistor 21 whose drain (one end of a pair of input-output terminals) is connected to a positive-voltage VDD (first power-supply voltage) supplied from a high-voltage power supply 5, and a second transistor 22 whose source (one end of a pair of input-output terminals) is connected to a ground potential VSS (second power-supply voltage). A source (the other end of the pair of input-output terminals) of the first transistor 21 is connected to a drain (the other end of the pair of input-output terminals) of the second transistor 22, whereby a half-bridge circuit in which the first transistor 21 and the second transistor 22 are connected in series is formed.

The first transistor 21 and the second transistor 22 are respectively a normally-on n-channel FET made of a wide-gap semiconductor having a threshold voltage Vth of about −3 V. The positive voltage VDD is about 400 V, for example.

A positive terminal of the control circuit power supply 14 is connected to the ground potential VSS, whereby the potential on a negative terminal of the control circuit power supply 14 becomes a negative voltage VEE (third power-supply voltage) with respect to the VSS. The negative voltage VEE is supplied to a low-voltage-side power-supply terminal 12b of the second control circuit 12, and is used to control the second transistor 22 to be turned off. The negative voltage VEE is lower than the negative threshold voltage Vth of the first transistor 21 and the second transistor 22, and it is about −10 V, for example.

The high-side first control circuit 11 includes a high-voltage-side power-supply terminal 11a and a low-voltage-side power-supply terminal 11b. The circuit 11 generates a first control signal 6 for controlling on/off of the first transistor 21 based upon the high-side input control signal 2, and outputs the resultant to the gate of the first transistor 21. Specifically, when the first transistor 21 is controlled to be turned on, for example, the voltage on the high-voltage-side power-supply terminal 11a is outputted to the gate of the first transistor 21 as the control signal 6 for turning on the first transistor 21, and when the first transistor 21 is controlled to be turned off, the voltage on the low-voltage-side power-supply terminal 11b is outputted to the gate of the first transistor 21 as the control signal 6 for turning off the first transistor 21.

The low-side second control circuit 12 includes a high-voltage-side power-supply terminal 12a and a low-voltage-side power-supply terminal 12b. The circuit 12 generates a second control signal 7 for controlling on/off of the second transistor 22 based upon the low-side input control signal 3, and outputs the resultant to the gate of the second transistor 22. Specifically, when the second transistor 22 is controlled to be turned on, for example, the voltage on the high-voltage-side power-supply terminal 12a is outputted to the gate of the second transistor 22 as the control signal 7 for turning on the second transistor 22, and when the second transistor 22 is controlled to be turned off, the voltage on the low-voltage-side power-supply terminal 12b is outputted to the gate of the second transistor 22 as the control signal 7 for turning off the second transistor 22.

One end of the capacitor 13 is connected to the negative voltage VEE via the switching element 30, while the other end is connected to the source of the first transistor 21, i.e., to a connection node of the first transistor 21 and the second transistor 22. One end of the capacitor 13 is also connected to the low-voltage-side power-supply terminal 11b of the first control circuit 11.

The switching element 30 is controlled based upon the low-side input control signal 3, and is turned on upon the timing when the second transistor 22 is turned on, i.e, upon the timing when the potential on the output terminal 4 of the driver circuit 1 is the closest to the VSS. The switching element 30 is then turned off on the timing when the second transistor 22 is turned off.

When the switching element 30 is on, the first transistor 21 is off and the second transistor 22 is on. Therefore, current flows through the capacitor 13 from the control circuit power supply 14 via the switching element 30 and the second transistor 22, whereby the capacitor 13 is charged such that the side connected to the high-voltage-side power-supply terminal 11a becomes positive, and the side connected to the low-voltage-side power-supply terminal 11b becomes negative. In this case, the negative voltage VEE of the control circuit power supply 14 is inputted to the control terminal of the first transistor 21 via the switching element 30 and the low-voltage-side power-supply terminal 11b as the negative gate voltage for maintaining the first transistor 21 in the off state.

Then, the on/off of the first transistor 21, the second transistor 22, and the switching element 30 is controlled based upon the high-side input control signal 2 and the low-side input control signal 3 in order that the first transistor 21 is turned on, and the second transistor 22 and the switching element 30 are turned off. Since the first transistor 21 and the second transistor 22 are respectively the normally-on n-channel FET, each transistor is in on state when the voltage on the source terminal is applied to the gate as the voltage of the high-voltage-side power-supply terminal. In this case, the potential of the output terminal 4 rises near the positive voltage VDD, since the first transistor 21 is on.

On the other hand, since the second transistor 22 and the switching element 30 are off, the capacitor 13 is separated from the control circuit power supply 14, and functions as the power supply of the first control circuit 11. Since the potential on the positive side of the capacitor 13 is the potential (i.e., the potential of the output terminal 4) of the connection node between the first transistor 21 and the second transistor 22, and the potential on the negative side becomes lower than the potential of the connection node, the voltage lower than the potential of the connection node can be supplied to the gate of the first transistor 21. As a result, the first transistor 21 can surely be turned off in the switching afterward.

Figure 2:
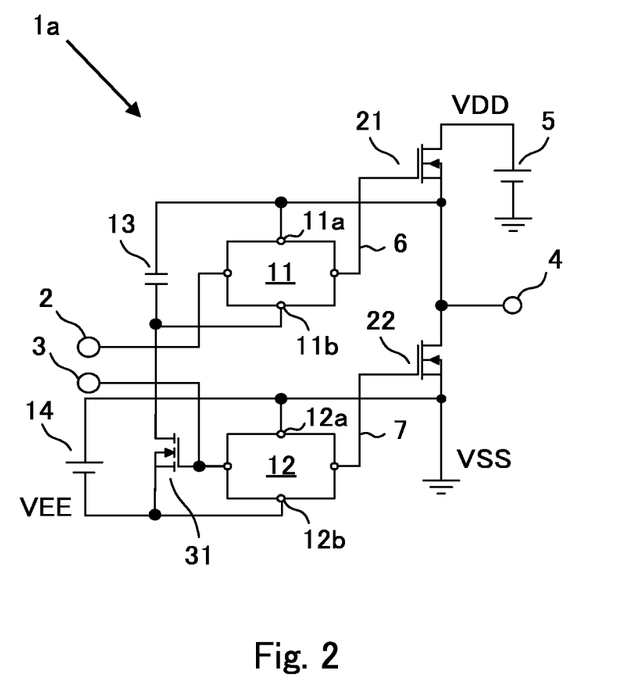
FIG. 2 is a circuit diagram illustrating an example of a structure of the driver circuit according to the present invention, when a MOSFET is used as a switching element.

FIG. 2 is a circuit diagram illustrating an example of a structure of the driver circuit 1 according to the present invention, when the switching element 30 is realized by an n-channel MOSFET 31. The driver circuit 1a illustrated in FIG. 2 can adapt to a higher-speed switching by replacing the switching element 30 with the MOSFET 31. Thus the processing speed of the driver circuit can be increased. In FIG. 2, one end of the MOSFET 31 is connected to the negative voltage VEE lower than the ground voltage VSS. Therefore, when a voltage higher than the threshold voltage of the MOSFET 31 with the VEE being defined as a reference is inputted to the gate of the MOSFET 31 as the low-side input control signal 3, the MOSFET 31 is turned on, and when the voltage lower than the threshold voltage with the VEE being defined as a reference is inputted to the gate terminal of the MOSFET 31, the MOSFET 31 is turned off. It is obvious that not only the MOSFET but also the bipolar transistor can be used as the switching element 30, and an element composed of a wide-gap semiconductor can also be used.

Figure 3:
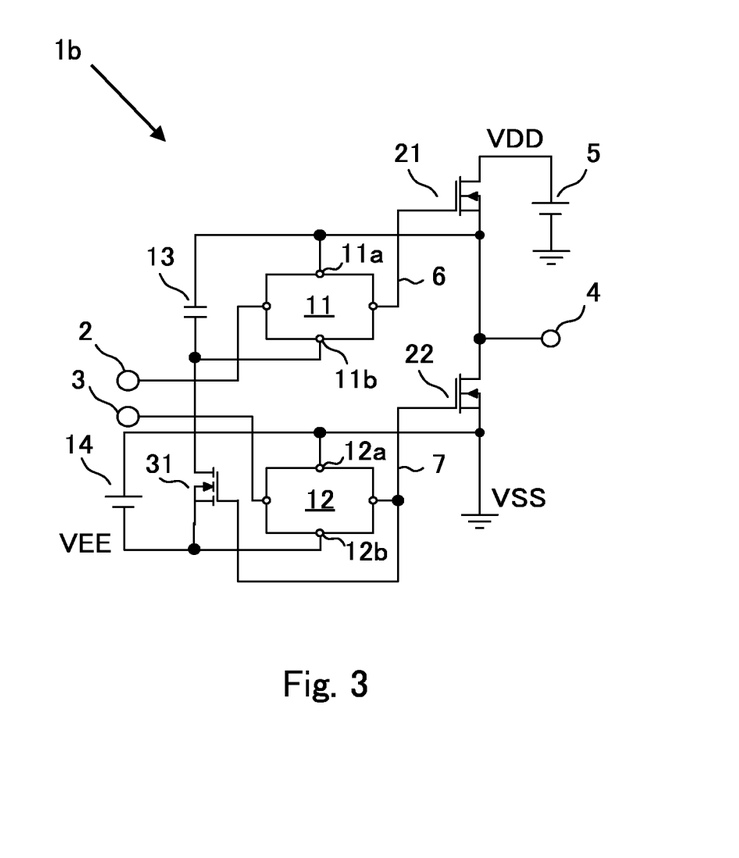
FIG. 3 is a circuit diagram illustrating another example of a structure of the driver circuit according to the present invention.

FIG. 3 illustrates a structure in which the control signal for turning on or off the MOSFET 31 is supplied from the output terminal of the second control circuit 12 in the driver circuit 1a, having the MOSFET 31 as the switching element 30, illustrated in FIG. 2. Specifically, in a driver circuit 1b illustrated in FIG. 3, the MOSFET 31 is turned on (off) on the timing when the second transistor 22 is turned on (off) in consideration of the signal delay of the low-side input control signal 3 generated in the second control circuit 12.

This operation can prevent the MOSFET 31 from being turned on before the second transistor 22 is changed to on from the state in which the first transistor 21 is on and the second transistor 22 is off, and can prevent the MOSFET 31 from being turned on with the potential of the output terminal 4 being high.

When the MOSFET 31 is on, the negative voltage VEE is applied to one end of the capacitor 13 and the low-voltage-side power-supply terminal 11b of the first control circuit 11, and the voltage of the output terminal 4 is applied to the other end of the capacitor 13 and the high-voltage-side power-supply terminal 11a of the first control circuit 11. When the MOSFET 31 keeps in its on state during the on state of the first transistor, the voltage of the output terminal 4 increases to the VDD in the worst case, whereby an unexpected high voltage might be applied to both ends of the capacitor 13 and the first control circuit 11.

However, the driver circuit 1b illustrated in FIG. 3 can surely prevent the MOSFET 31 from being turned on with the first transistor 21 being on, i.e., with the potential of the output terminal 4 being high, with the result that the one having low breakdown voltage can be used as the capacitor 13. Accordingly, the driver circuit 1b can prevent the first control circuit 11 from stopping its operation.

Figure 4:
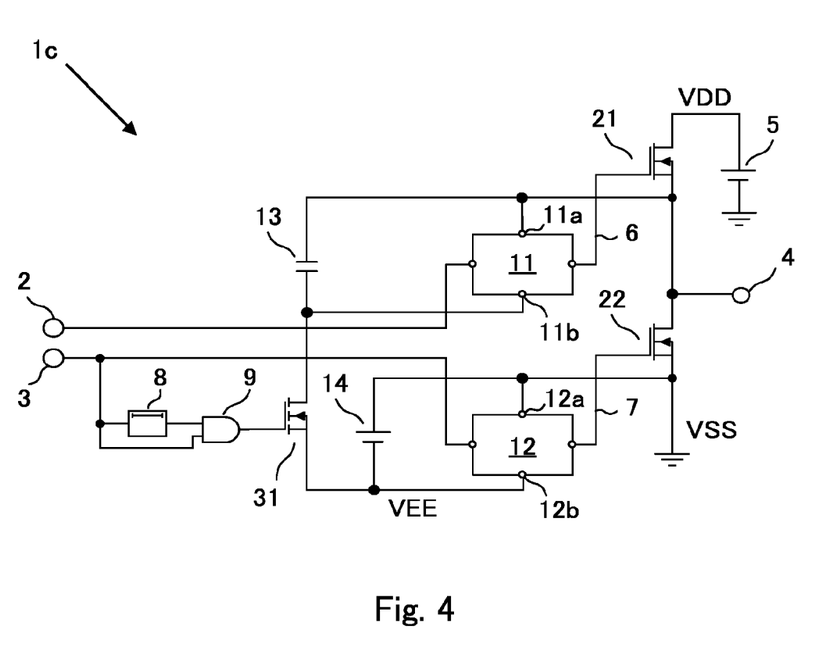
FIG. 4 is a circuit diagram illustrating another example of a structure of the driver circuit according to the present invention.
Figure 5:
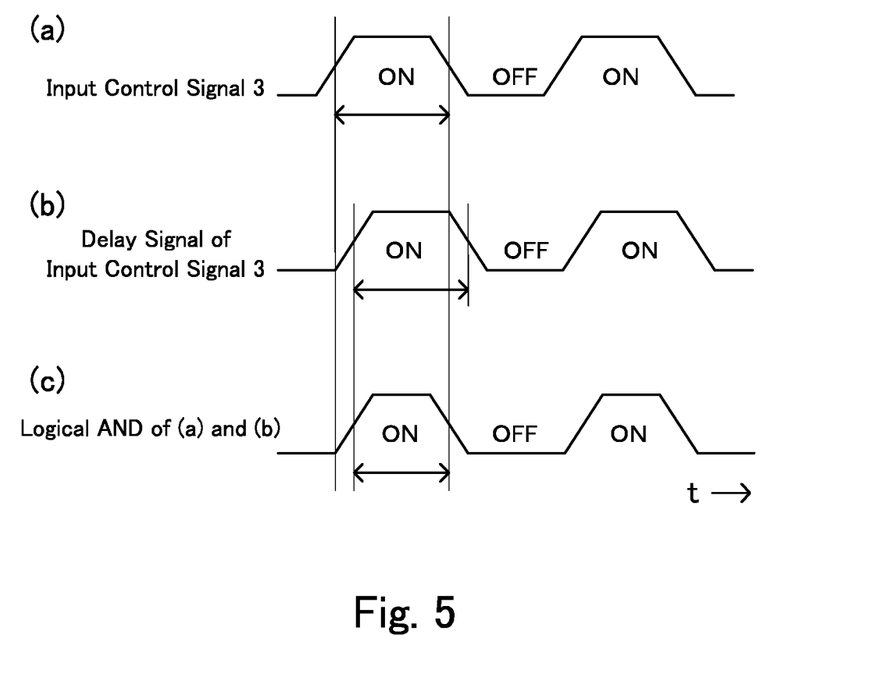
FIG. 5 is a waveform chart illustrating a temporal change of a low-side input control signal, a delay signal thereof, and a signal resulting from a logical AND of the low-side input control signal and the delay signal.

FIG. 4 is a circuit diagram illustrating another embodiment realizing the driver circuit according to the present invention, and FIG. 5 is a signal waveform chart of its operation. In a driver circuit 1c illustrated in FIG. 4, a logical AND of the low-side input control signal 3 (FIG. 5(a)) and a delay signal (FIG. 5(b)) of the low-side input control signal 3 via the delay circuit 8 is calculated in an AND circuit 9, and the signal (FIG. 5(c)) of the logical AND is inputted to the gate of the MOSFET 31 as the control signal for turning on or off the MOSFET 31. The delay time in the delay circuit 8 is set to be equal to or longer than the signal delay time of the low-side input control signal 3 generated in the second control circuit 12.

This structure can surely turn on the MOSFET 31 with the voltage of the output terminal 4 being low, and when the control signal for turning off the second transistor 22 is inputted to the low-side input control signal 3, the MOSFET 31 is immediately turned off. Accordingly, this structure can surely prevent that the MOSFET 31 is turned on with the voltage of the output terminal 4 being high.

Figure 6:
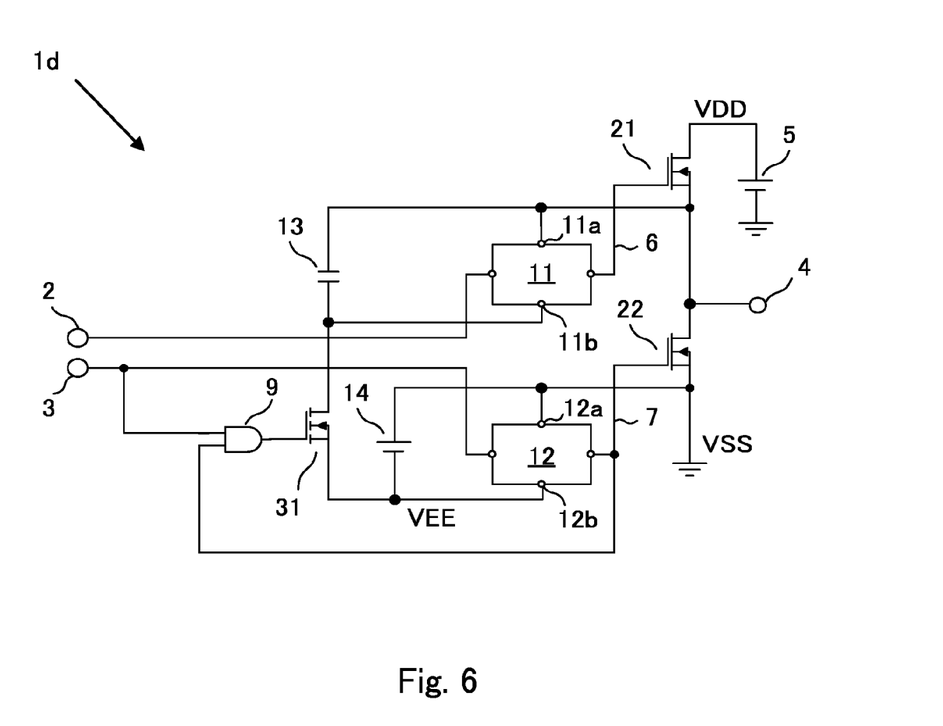
FIG. 6 is a circuit diagram illustrating another example of a structure of the driver circuit according to the present invention.

FIG. 6 is a circuit diagram illustrating still another embodiment realizing the driver circuit according to the present invention. In a driver circuit 1d illustrated in FIG. 6, a logical AND of the low-side input control signal 3 and an output signal (the second control signal 7) of the second control circuit 12 is calculated, and the signal of the logical AND is inputted to the gate terminal of the MOSFET 31 as the control signal for turning on or off the MOSFET 31.

The driver circuit 1d can surely prevent that the MOSFET 31 is turned on with the voltage of the output terminal 4 being high, like the above-mentioned driver circuit 1c.

In the driver circuit 1, and the driver circuits 1a to 1d, the negative voltage VEE can be supplied to the second control circuit 12, and the gate of the second transistor 22, the capacitor 13 can be charged via the switching element 30 (MOSFET 31) that becomes on when the second transistor is on, and the negative voltage can be supplied to the first control circuit 11 and the first transistor 21. Accordingly, these driver circuits can supply the negative voltage for turning off the first transistor 21 without being provided with an insulated power supply in addition to the control circuit power supply 14.

It is described in detail in the first embodiment that the first transistor 21 and the second transistor 22 are the normally-on FET using the wide-gap semiconductor. When the first transistor 21 and the second transistor 22 are the normally-off FET having a threshold voltage of about 2 V, a power supply circuit for increasing the voltage of the high-voltage-side power-supply terminal 11a (12a) connected to the source of the transistor, to be not less than at least the threshold voltage of the transistor is additionally provided, and the increased voltage is inputted to the gate terminal, in order to turn on the first transistor 21 and the second transistor 22.

Second Embodiment

FIG. 7 is a graph illustrating dependency of a reverse conducting characteristic (a change in current Id flowing between a drain and a source when a voltage Vds that is negative with respect to the source is applied to the drain side) of a normally-on FET, having a threshold voltage Vth of −2.5 V, on a gate voltage Vgs. The change in the characteristic is illustrated when the Vgs is increased by +0.5 V from −5 V from the left of the graph.

From FIG. 7, in case where the threshold voltage Vth is about −2.5 V, the reverse conducting on-set voltage by which the reverse conducting state is attained is −2.5 V, −2.0 V, and −1.5 V, respectively, when the gate voltage Vgs applied in the off state is −5.0 V, −4.5 V, and −4.0 V. In the present embodiment, when the first transistor 21 or the second transistor 22 is the normally-on FET, a value of a third power-supply voltage is adjusted in order that the reverse conducting on-set voltage falls within a range of −1.5 V to −3.0 V. Specifically, the third power-supply voltage VEE is set to be within the range of −5.0 V to −4.0 V in order that the gate voltage Vgs supplied via the third power-supply voltage VEE falls within the range of −5.0 V to −4.0 V.

According to this structure, even if the first transistor 21 or the second transistor 22 is the normally-on FET, the reverse conducting operation can be realized with the reverse conducting on-set voltage whose absolute value is reduced within the range of −1.5 V to −3.0 V.

The forward voltage of a FWD generally used for an inverter is about 1.5 V to 3.0 V. Therefore, with the structure described above, the reverse conducting operation can surely be realized by using the driver circuit 1 (1a to 1d) according to the present invention without a need of the FWD that is generally required to be connected to the inverter switching element in parallel.

INDUSTRIAL APPLICABILITY

The present invention is applicable to a driver circuit that supplies a voltage used for a control of a control terminal of a switching element, and when the driver circuit according to the present invention is used for the control of the switching element using a wide bandgap semiconductor such as GaN or SiC, a negative voltage can be supplied, with a simple structure, to a switching element having a normally-on characteristic, or a switching element having a normally-off characteristic having a low threshold voltage of about 2 V, in order to turn off the switching element.

EXPLANATION OF REFERENCES 1, 1a to 1d: Driver Circuit According To Present Invention
2: High-Side Input Control Signal
3: Low-Side Input Control Signal
4: Output Terminal
5: High-Voltage Power Supply
6: First Control Signal
7: Second Control Signal
8: Delay Circuit
9: And Circuit
11: First Control Circuit (High-Side)
11a: High-Voltage-Side Power-Supply Terminal
11b: Low-Voltage-Side Power-Supply Terminal
12: Second Control Circuit (Low-Side)
12a: High-Voltage-Side Power-Supply Terminal
12b: Low-Voltage-Side Power-Supply Terminal
13: Capacitor
14: Control Circuit Power Supply
21: First Transistor
22: Second Transistor
30: Switching Element
31: Mosfet
VDD: Positive Voltage (First Power-Supply Voltage)
VSS: Ground Potential (Second Power-Supply Voltage)
VEE: Negative Voltage (Third Power-Supply Voltage)

The invention claimed is:

1. A driver circuit including a first transistor in which one end of a pair of input-output terminals is connected to a first power-supply voltage, and a second transistor in which one end of a pair of input-output terminals is connected to a second power-supply voltage that is lower than the first power-supply voltage, the first transistor and the second transistor being connected in series, the driver circuit outputting a voltage of an intermediate node between the first transistor and the second transistor, the driver circuit comprising:
 a first control circuit that includes a high-voltage-side power-supply terminal and a low-voltage-side power-supply terminal, and that outputs a first control signal for controlling on/off of the first transistor to a control terminal of the first transistor based upon an input signal;
 a second control circuit that has a high-voltage-side power-supply terminal and a low-voltage-side power-supply terminal, and that outputs a second control signal for controlling on/off of the second transistor to a control terminal of the second transistor based upon an input signal;
 a switching element; and
 a capacitor that generates a power-supply voltage that is to be supplied to the first control circuit, wherein
 one end of the capacitor is connected through the switching element to a third power-supply voltage lower than the second power-supply voltage via the switching element, and the other end of the capacitor is connected to the other end of the input-output terminals of the first transistor,
 the voltage on one end of the capacitor is supplied to the low-voltage-side power-supply terminal of the first control circuit,
 the third power-supply voltage is supplied to the low-voltage-side power-supply terminal of the second control circuit,
 the first control circuit outputs the voltage supplied to the low-voltage-side power-supply terminal of the first control circuit as the first control signal, when turning off the first transistor,
 the second control circuit outputs the voltage supplied to the low-voltage-side power-supply terminal of the second control circuit as the second control signal, when turning off the second transistor, and
 the switching element is controlled to be in on state when the second transistor is in on state; and
wherein
 the first transistor is a normally-on n-channel FET using a wide-gap semiconductor, and
 the high-voltage-side power-supply terminal of the first control circuit is connected to the other end of the input-output terminals of the first transistor.

2. The driver circuit according to claim 1, wherein
 the second transistor is a normally-on n-channel FET using a wide-gap semiconductor, and
 the high-voltage-side power-supply terminal of the second control circuit is connected to the second power-supply voltage.

3. The driver circuit according to claim 1, wherein the switching element includes a MOSFET.

4. The driver circuit according to claim 3, wherein on/off of the switching element is controlled based upon the second control signal.

5. The driver circuit according to claim 3, wherein on/off of the switching element is controlled based upon a signal resulting from a logical AND of the input signal inputted to the second control circuit and a delay signal of the input signal.

6. The driver circuit according to claim 3, wherein on/off of the switching element is controlled based upon a signal resulting from a logical AND of the input signal inputted to the second control circuit and the second control signal.

7. The driver circuit according to claim 1, wherein
the first transistor is a normally-on n-channel FET, and
the third power-supply voltage is set to be a voltage by which a reverse conducting operation of the first transistor is possible, when the first transistor is turned off by an input of the first control signal.

8. The driver circuit according to claim 1, wherein
the second transistor is a normally-on n-channel FET, and
the third power-supply voltage is set to be a voltage by which a reverse conducting operation of the second transistor is possible, when the second transistor is turned off by an input of the second control signal.

9. The driver circuit according to claim 7, wherein the third power-supply voltage is set such that a reverse conducting on-set voltage of at least either one of the first transistor and the second transistor falls within a range of −1.5 V to −3.0 V.

* * * * *